(12) United States Patent
Matsuda et al.

(10) Patent No.: US 8,809,942 B2
(45) Date of Patent: Aug. 19, 2014

(54) SEMICONDUCTOR DEVICE HAVING TRENCH STRUCTURE

(75) Inventors: Shizue Matsuda, Hyogo-ken (JP); Shingo Sato, Hyogo-ken (JP); Wataru Saito, Hyogo-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 221 days.

(21) Appl. No.: 13/419,400

(22) Filed: Mar. 13, 2012

(65) Prior Publication Data
US 2013/0069109 A1    Mar. 21, 2013

(30) Foreign Application Priority Data
Sep. 21, 2011  (JP) ................. P2011-205704

(51) Int. Cl.
*H01L 29/772*  (2006.01)

(52) U.S. Cl.
USPC .................. 257/330; 257/E29.257

(58) Field of Classification Search
CPC ............ H01L 29/7811; H01L 29/7813; H01L 29/7827; H01L 29/4236
USPC ............ 257/330, E29.257; 438/270
See application file for complete search history.

(56) References Cited

U.S. PATENT DOCUMENTS

| | | | |
|---|---|---|---|
| 2002/0096710 A1* | 7/2002 | Inagawa et al. | 257/330 |
| 2009/0008723 A1* | 1/2009 | Schmidt | 257/409 |
| 2009/0309193 A1* | 12/2009 | Seki et al. | 257/623 |
| 2010/0230747 A1* | 9/2010 | Barletta | 257/334 |
| 2012/0049274 A1* | 3/2012 | Elattari et al. | 257/330 |

FOREIGN PATENT DOCUMENTS

| JP | 3875245 | 11/2006 |
|---|---|---|
| JP | 2009-004547 | 1/2009 |

OTHER PUBLICATIONS

L. Théolier, et al. A New Junction Termination Technique: The Deep Trench Termination (DT²), ISPSD' 08-09, 2009.

\* cited by examiner

*Primary Examiner* — Steven J Fulk
(74) *Attorney, Agent, or Firm* — Patterson & Sheridan, LLP

(57) ABSTRACT

According to an embodiment, a trench structure and a second semiconductor layer are provided in a semiconductor device. In the trench structure, a trench is provided in a surface of a device termination portion with a first semiconductor layer of a first conductive type including a device portion and the device termination portion, and an insulator is buried in the trench in such a manner to cover the trench. The second semiconductor layer, which is of a second conductive type, is provided on the surface of the first semiconductor layer, is in contact with at least a side on the device portion of the trench, and has a smaller depth than the trench. The insulator and a top passivation film for the semiconductor device are made of the same material.

4 Claims, 20 Drawing Sheets

SEMICONDUCTOR DEVICE HAVING TRENCH STRUCTURE

CROSS REFERENCE TO RELATED APPLICATION

This application is based upon and claims the benefit of priority from the prior Japanese Patent Application No. 2011-205704, filed on Sep. 21, 2011, the entire contents of which are incorporated herein by reference.

FIELD

Embodiments described herein relate to a semiconductor device having a trench structure and a method of manufacturing the same.

BACKGROUND

A power device such as a diode, a power MOS transistor, and an insulated gate bipolar transistor (IGBT) needs to be provided with a device termination portion including a guard ring layer or a resurf layer, and the like, in order to ensure a breakdown voltage of the power device.

In the case where the guard ring layer or the resurf layer is provided in the device termination portion, it is difficult to shrink the width of the device termination portion. Moreover, the manufacturing processes for power devices increase when a semiconductor layer being different from the device formation region is provided in the device termination portion.

DETAILED DESCRIPTION

Figure 1:
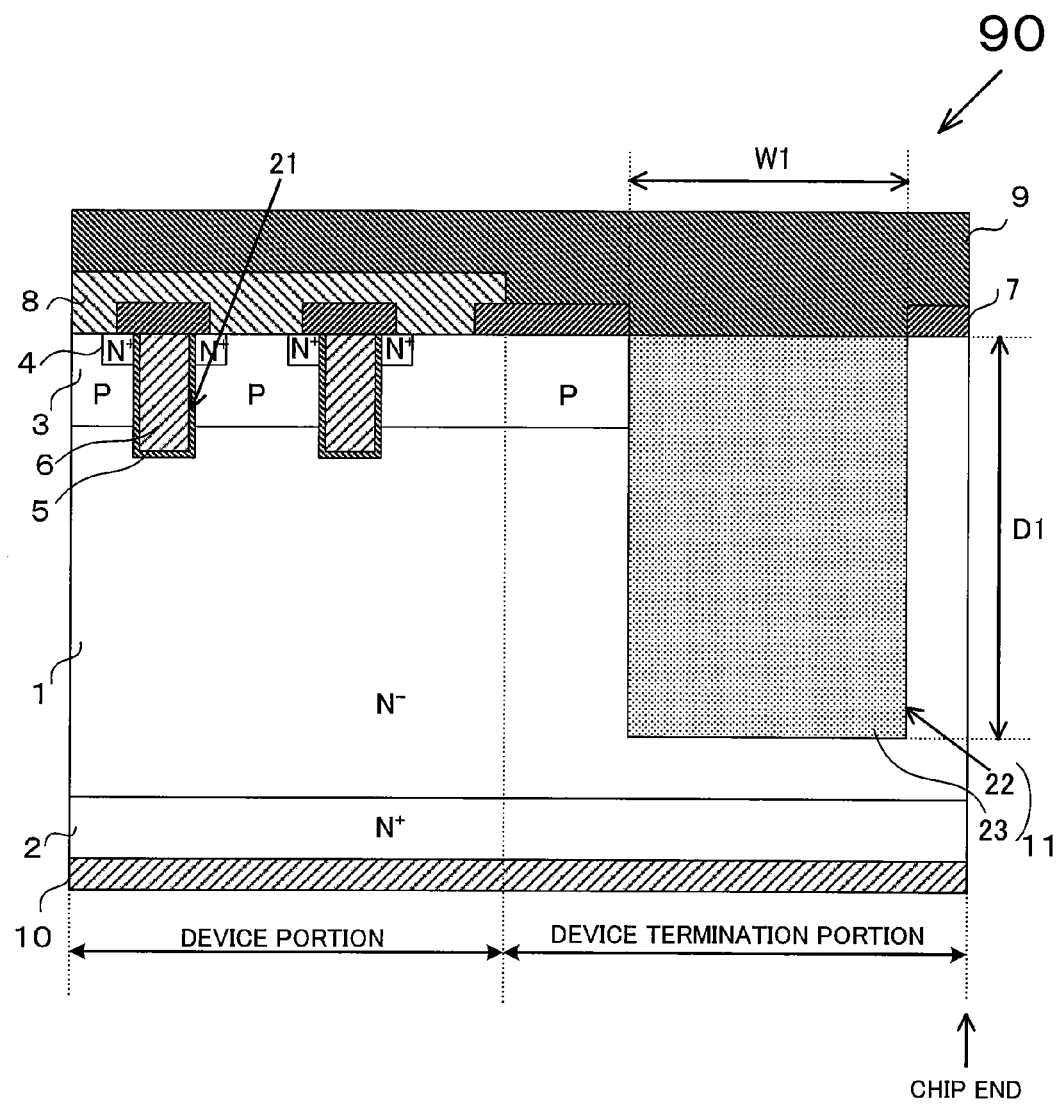
FIG. 1 is a cross-sectional diagram showing a semiconductor device according to a first embodiment.

According to an embodiment, a trench structure and a second semiconductor layer are provided in a semiconductor device. In the trench structure, a trench is provided in a surface of a device termination portion with a first semiconductor layer of a first conductive type including a device portion and the device termination portion, and an insulator is buried in the trench in such a manner to cover the trench. The second semiconductor layer, which is of a second conductive type, is provided on the surface of the first semiconductor layer, is in contact with at least a side on the device portion of the trench, and has a smaller depth than the trench. The insulator and a top passivation film for the semiconductor device are made of the same material.

Hereinafter, further plural examples are described with reference to the drawings. In the drawings, the same numeral indicates the same or similar portions.

A semiconductor device and a method of manufacturing the same according to a first embodiment will be described with reference to the drawings. FIG. 1 is a cross-sectional diagram showing the semiconductor device. In the embodiment, a trench structure in which an insulator is buried in a trench is provided in a device termination portion of a trench power MOS transistor.

As shown in FIG. 1, a semiconductor device 90 is an N-channel trench power MOS transistor in which a trench structure 11 as a deep trench is provided in the device termination portion. The semiconductor device 90 is used for a mobile terminal, a personal computer, a motor driver, and the like.

A P-base layer 3 is formed in a first main surface (front surface) of an $N^-$-drift layer 1. An $N^+$-drain layer 2 with an impurity concentration higher than that of the $N^-$-drift layer 1 is formed in a second main surface (back surface) opposite to the first main surface (front surface) of the $N^-$-drift layer 1. In the embodiment, the $N^-$-drift layer 1 is used as a semiconductor substrate, and the $N^+$-drain layer 2 as a diffusion layer is formed in the back surface of the semiconductor substrate. When the $N^+$-drain layer 2 serves as the semiconductor substrate, the $N^-$-drift layer 1 serves as an epitaxial layer.

Trenches 21 that penetrate through the P-base layer 3 to reach the $N^-$-drift layer 1 are formed in the P-base layer 3. A gate insulating film 5 is provided on bottom and side surfaces of each trench 21. A gate electrode 6 is buried in the trench 21 in such a manner to cover the trench 21 via the gate insulating layer 5. The gate insulating film 5 and the gate electrode 6 compose a trench gate and serve as the gate together. An $N^+$-source layer 4 is provided in a portion of a surface of the P-base layer 3 in contact with the trench 21.

An insulating layer 7 is provided on the N⁻-drift layer 1, the P-base layer 3, the N⁺-source layers 4, and the trench gate. Portions of the insulating layer 7 on the P-base layer 3 and the N⁺-source layers 4 are etched, and thus unillustrated first opening portions are formed in the device portion. A source electrode 8 is formed on the P-base layer 3 and the N⁺-source layer 4 exposed through the first opening portions, as well as the insulating film 7.

A portion of the insulating film 7 on the N⁻-drift layer 1 is etched, and thus an unillustrated second opening is formed in the device termination portion. One end of the second opening (on a device portion side) is in contact with the P-base layer 3. A trench structure 11 having a width W1 and a depth D1 is formed in a surface portion of the N⁻-drift layer 1 below the device termination portion. The trench structure 11 includes a trench 22 and an insulator 23 buried in the trench 22 in such a manner to cover the trench 22. The depth D1 is set to be larger than a depth of the P-base layer 3. In the drawing, the trench 22 does not reach the N⁺-drain layer 2, but may be formed to reach the N⁺-drain layer 2. The width W1 is appropriately set to correspond to characteristics of a breakdown voltage required for the semiconductor device 90 and is set to be larger than a width of the trench gate.

An insulating film 9 is formed on the second opening portion, the insulating film 7, and the source electrode 8. The insulating film 9 serves as a top passivation film to protect the semiconductor device 90 from a contamination, moisture, and the like entering from the outside. The insulator 23 of the trench structure 11 has an upper portion in direct contact with the insulating film 9. The insulator 23 and the insulating film 9 are formed of the same material in this configuration, but may be formed of different materials. The insulating film 9 may be formed of stacked films which are composed of same materials or different materials of the same species. A drain electrode 10 is formed on a second main surface (back surface) opposite to a first main surface (surface in contact with the N⁻-drift layer 1) of the N⁺-drain layer 2.

A polyimide (PI) film, for example, is used for the insulator 23 and the insulating film 9. The polyimide (PI) film has a dielectric constant of 3.2 to 3.5 which is lower than that of a silicon dioxide film. The polyimide is cured (imidized) at a temperature of 300 to 400° C. to have high insulating property and is a material having a high heat resistance as an organic material. A poly-benzoxazole (PBO), a poly-benzocyclobutene (BCB), a poly-fluorocarbon, a poly-arylether (PAE), or the like may be used instead of the polyimide (PI).

In the case where the trench structure 11 buried the insulator 23 is formed in the device termination portion, it is possible to have a shorter width than a device termination portion provided with a guard ring layer and a resurf layer. Moreover, none of various semiconductor layers being different from the device formation region needs to be provided in the device termination portion. Therefore, it is possible to reduce the manufacturing process for the semiconductor device 90.

Figure 2:
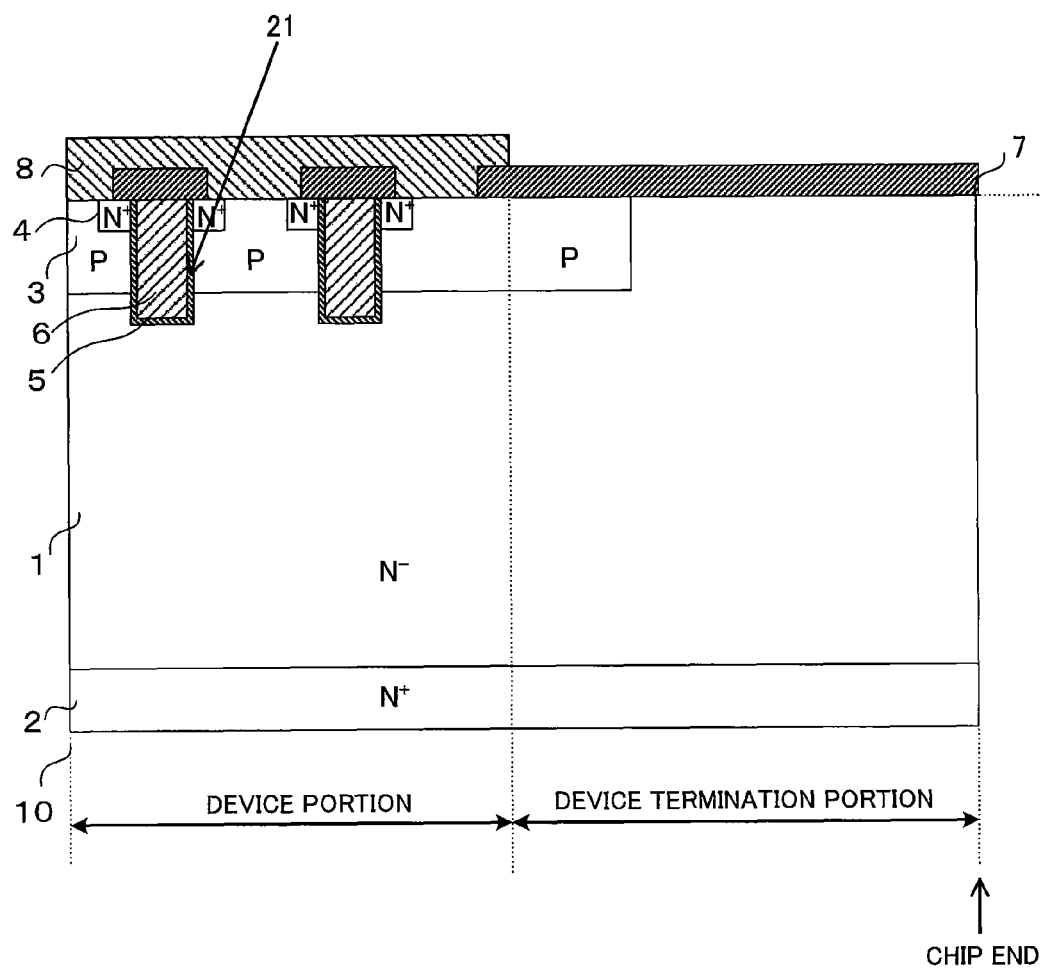
FIG. 2 is a cross-sectional diagram showing a manufacturing step for the semiconductor device according to the first embodiment.
Figure 3:
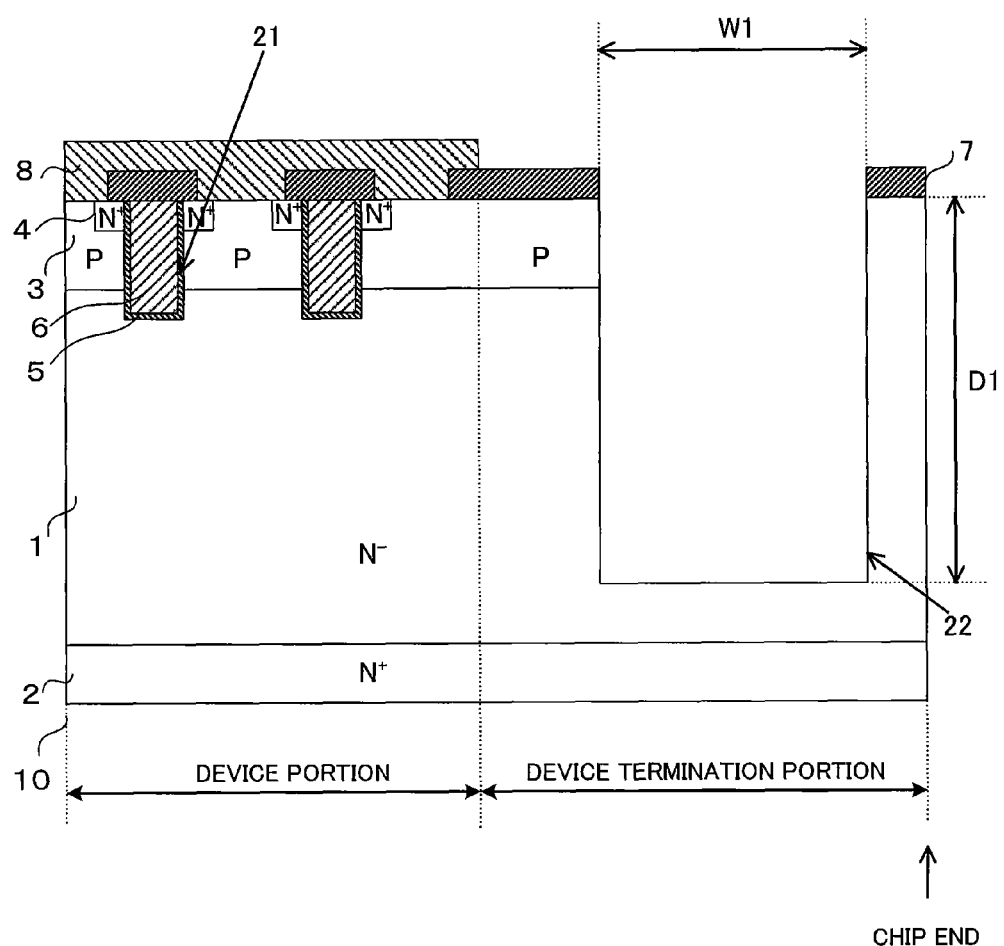
FIG. 3 is a cross-sectional diagram showing a manufacturing step for the semiconductor device according to the first embodiment.
Figure 4:
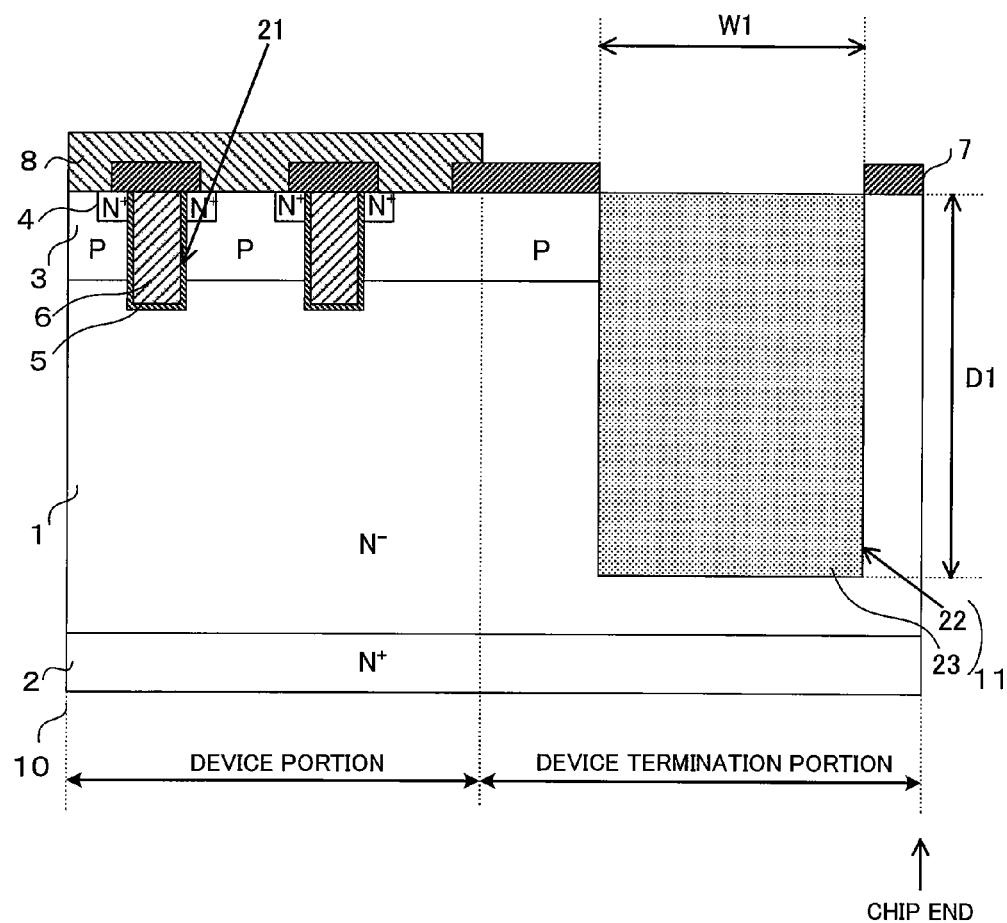
FIG. 4 is a cross-sectional diagram showing a manufacturing step for the semiconductor device according to the first embodiment.

Next, the method of manufacturing semiconductor device is described with reference to FIGS. 2 to 4. FIGS. 2 to 4 are cross-sectional diagrams showing manufacturing steps for the semiconductor device.

As shown in FIG. 2, the P-base layer 3, the trench gate, the N⁺-source layers 4, and the insulating layer 7 are formed on the front surface of the N⁻-drift layer 1. The N⁺-drain layer 2 is formed on the back surface of the N⁻-drift layer 1. The unillustrated opening portions are formed by etching the portions of the insulating layer 7 on the portion of the N⁻-drift layer 1 in the device portion. The source electrode 8 is formed on the P-base layer 3 and the N⁺-source layer 4 exposed through the opening portions, as well as the insulating layer 7. The above-described steps are performed using a well-known technique.

Next, as shown in FIG. 3, the opening portion is formed by etching the portion of the insulating film 7 in the device termination portion using reactive ion etching (RIE), for example with an unillustrated resist film as a mask. A portion of the N⁻-drift layer 1 below the opening portion is etched by deep RIE using a different gaseous species with the resist film as a mask, and thus the trench 22 having the width W1 and the depth D1 is formed. An exposed silicon surface is chemical-etched in order to smoothen the surface. After resist removal, a chemical treatment is performed on the bottom and side surfaces of the trench 22.

Then, as shown in FIG. 4, the insulator 23 is buried in the trench 22 in such a manner to cover the trench 22. The insulator 23 as the polyimide is patterned and is imidized at a relatively low temperature (e.g., 300 to 400° C.).

The insulating film 9 is formed on the insulator 23, the insulating film 7, and the source electrode 8. The drain electrode 10 is formed on the back surface of the N⁺-drain layer 2. Thus, the semiconductor device 90 is completed.

As described above, in the semiconductor device and the method of manufacturing the same of the embodiment, the trench structure 11 including the trench 22 and the insulator 23 buried in the trench 22 is provided in the device termination portion. The trench structure 11 has one end in contact with the P-base layer 3, is deeper than the trench gate and the P-base layer 3, and has the width W1 and the depth D1.

Accordingly, compared with a case where the guard ring layer and the reduced surface layer are provided, it is possible to shrink the width of the device termination portion. Moreover, it is possible reduce the manufacturing process for the semiconductor device 90.

Figure 20:
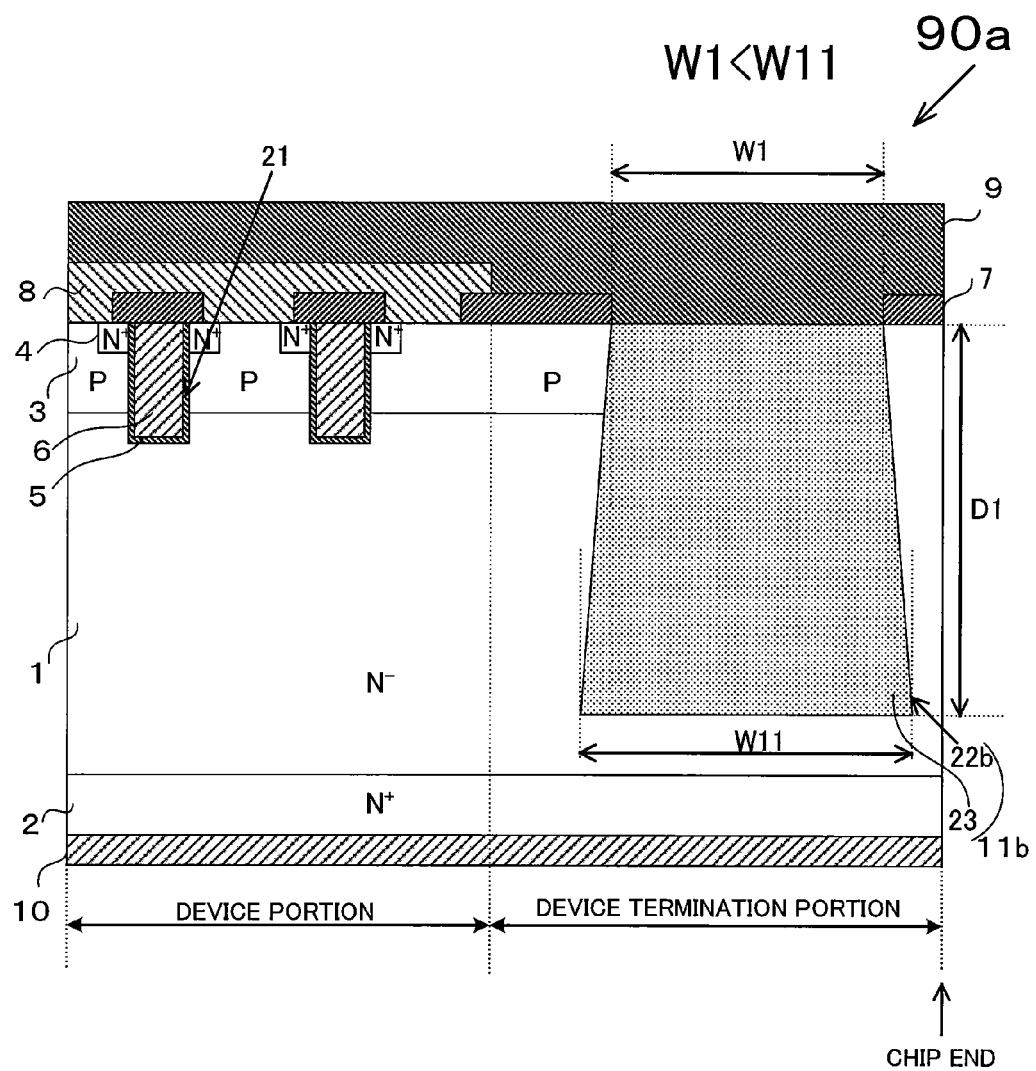
FIG. 20 is a cross-sectional diagram showing a semiconductor device of a modification.

In the embodiment, the shape of the trench is preferably a straight shape for controllability of a fabricated shape or a reverse taper shape in which a width of a trench spreads toward a bottom side of the trench for higher electrical characteristics, as shown in FIG. 20. Specifically, in a trench structure 11b of a semiconductor device 90a of a modification, a width W11 of a bottom portion of a trench 22b is larger than a width W1 of a upper portion of the trench 22b. In the case where a trench width with a reverse taper shape is provided, a creepage distance of a trench end portion increases, a equipotential width at a condition applied a voltage increases. Therefore, it is possible to reduce electric field concentration and improve a breakdown voltage. In the embodiment, the trench structure is applied to the N-channel trench power MOS transistor in the embodiment, may be applied to a P-channel trench power MOS transistor.

Figure 5:
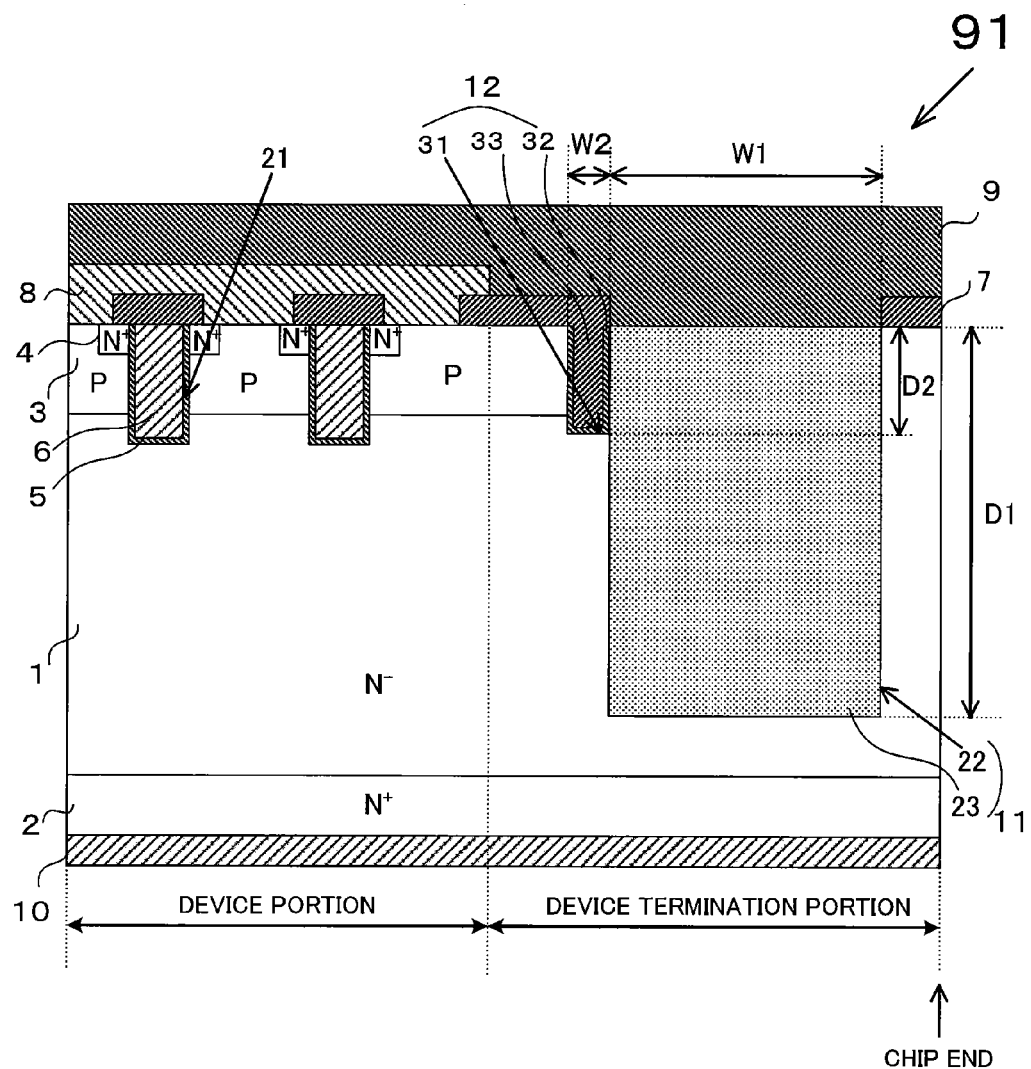
FIG. 5 is a cross-sectional diagram showing a semiconductor device according to a second embodiment.

The semiconductor device and a method of manufacturing the same according to a second embodiment will be described with reference to the drawings. FIG. 5 is a cross-sectional diagram showing the semiconductor device. In the embodiment, a first trench structure and a second trench structure are provided in the device termination portion of the trench power MOS transistor. The first trench structure is in contact with the P-base layer 3 and includes a first trench, a silicon dioxide film, and an insulating film. The second trench structure is in contact with the first trench structure and includes a second trench and an insulator.

Hereinafter, a portion with the same configuration in the first embodiment is provided with the same numeral, a description of the portion will not be repeated, and only a portion with a different configuration is described.

As shown in FIG. 5, a semiconductor device 91 is an N-channel trench power MOS transistor in which the trench structure 11 as a deep trench is formed in the device termination portion, and a trench structure 12 is formed between the trench structure 11 and the P-base layer 3. The semiconductor device 91 is used for a mobile terminal, a personal computer, a motor driver, and the like.

The trench structure 12 (first trench structure) is formed on a portion of the surface of the N⁻-drift layer 1 between the P-base layer 3 and the trench structure 11. The trench structure 12 has a width W2 and a depth D2. The width W2 is smaller than the width W1 of the trench structure 11 (second trench structure). The depth D2 is larger than the depth of the P-base layer 3 and is smaller than the depth D1 of the trench structure 11. The trench structure 12 includes a trench 31, an insulating film 32 formed of a silicon thermally-oxidized film ($SiO_2$ film) formed on bottom and side surfaces of the trench 31, and an insulating film 33 buried in the trench 31 in such a manner to cover the trench 31 via the insulating film 32.

In the case where the silicon thermally-oxidized film ($SiO_2$ film) formed by high temperature thermal oxidation of the surface of the N⁻-drift layer 1 performed at a relatively high temperature is used for the insulating film 32, it is possible to suppress a leak current flowing through a PN-junction portion.

Next, leak current characteristics at a PN-junction end portion of the semiconductor device (N-channel trench power MOS transistor) will be described.

In the semiconductor device 90 of the first embodiment (see FIG. 1), the side surface of the P-base layer 3 and a side surface of an upper portion in the insulator 23 of the trench structure 11 are in contact with each other.

In contrast, the trench structure 12 is formed between the trench structure 11 and the P-base layer 3 in the semiconductor device 91 of the embodiment (see FIG. 5). The side surface of the P-base layer 3 and the portion of the insulating film 32 (silicon thermally-oxidized film ($SiO_2$ film)) provided on the side surface of the trench 31 of the trench structure 12 are in contact with each other. The portion of the surface of the N⁻-drift layer 1 below the trench structure 12 and the portion of the insulating film 32 (silicon thermally-oxidized film ($SiO_2$ film)) provided on the bottom surface of the trench 31 of the trench structure 12 are in contact with each other.

As described above, the insulating film 32 formed of the silicon thermally-oxidized film ($SiO_2$ film) is provided in the semiconductor device 91 of the embodiment. Therefore, it is possible to reduce the leak current flowing through the PN-junction end portion in the device termination portion compared with the semiconductor device 90 of the first embodiment. Moreover, it is possible to improve semiconductor reliability.

Figure 6:
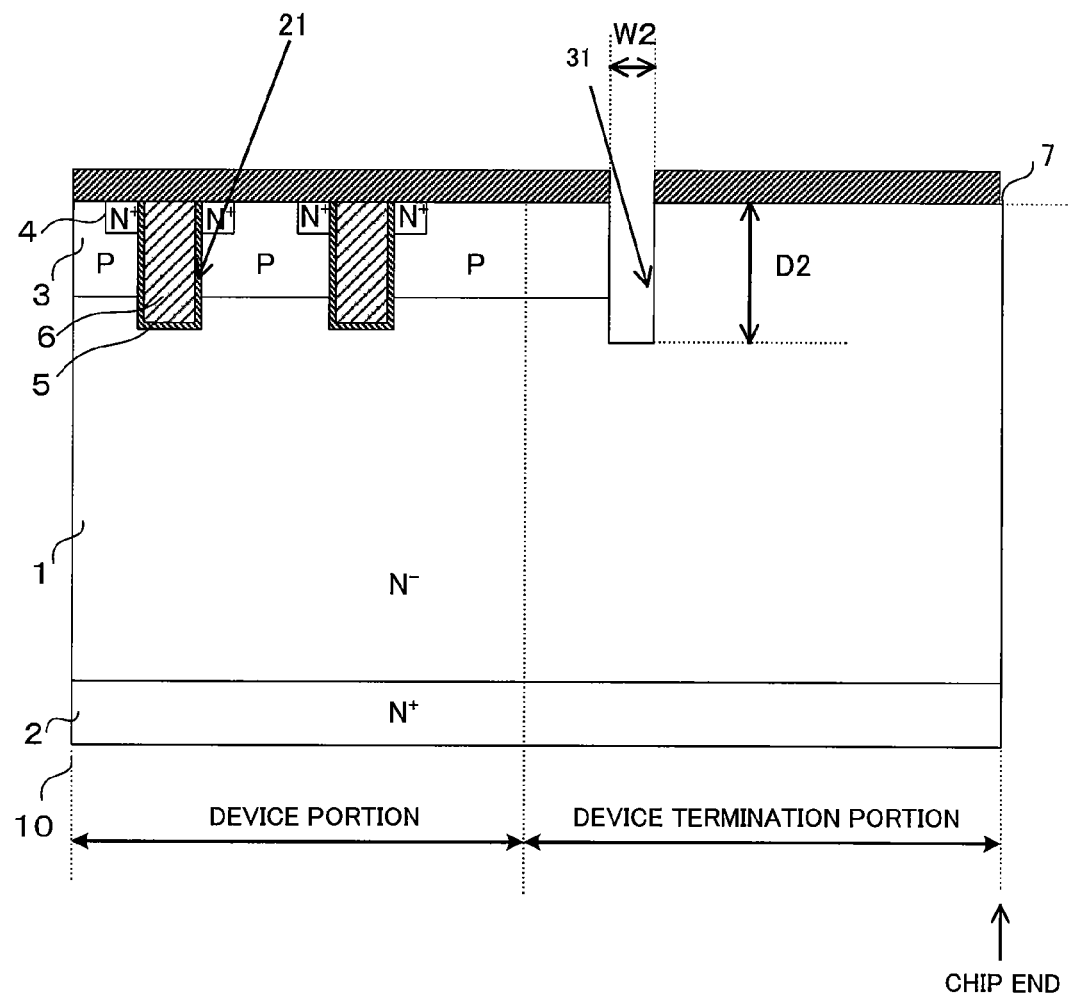
FIG. 6 is a cross-sectional diagram showing a manufacturing step for the semiconductor device according to the second embodiment.
Figure 7:
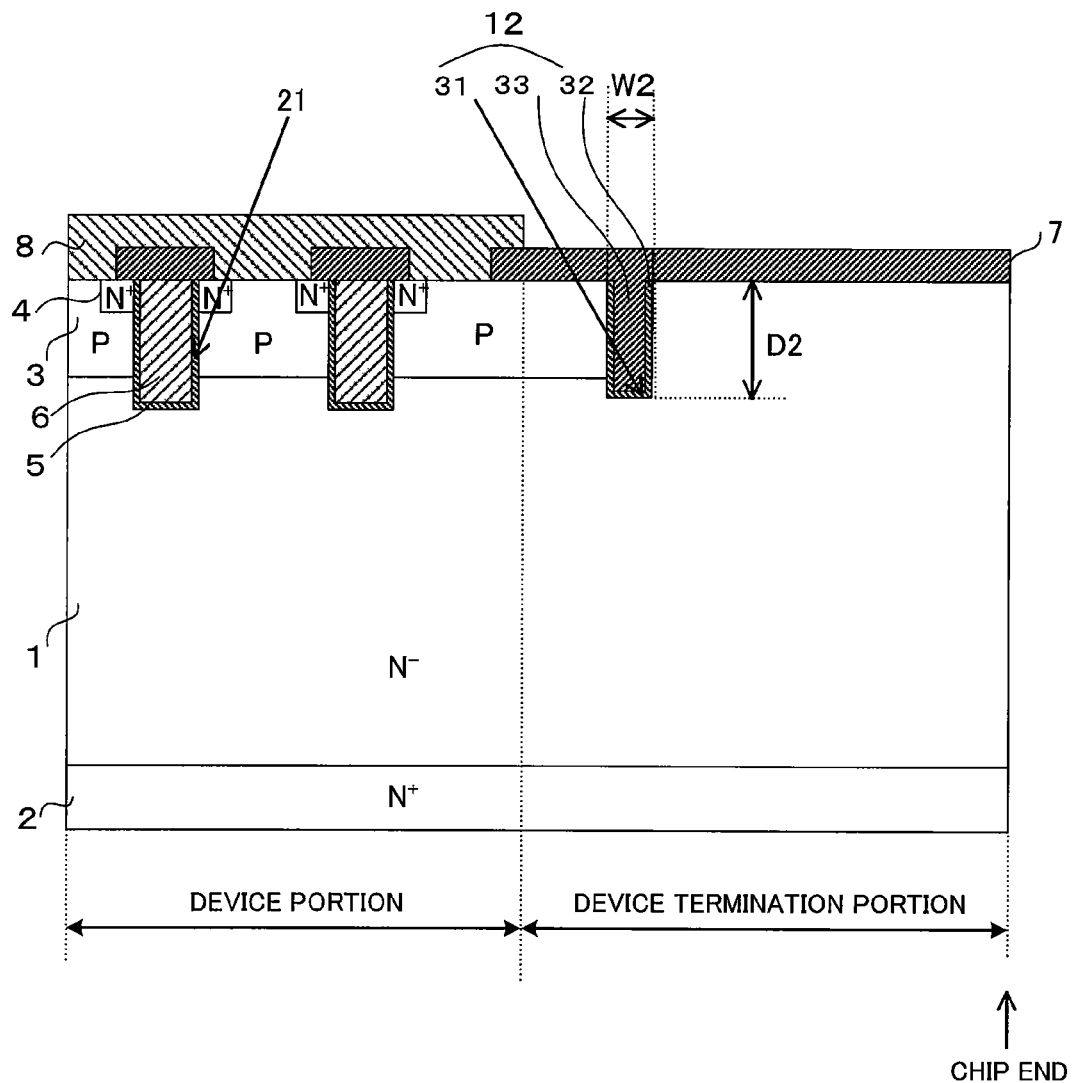
FIG. 7 is a cross-sectional diagram showing a manufacturing step for the semiconductor device according to the second embodiment.
Figure 8:
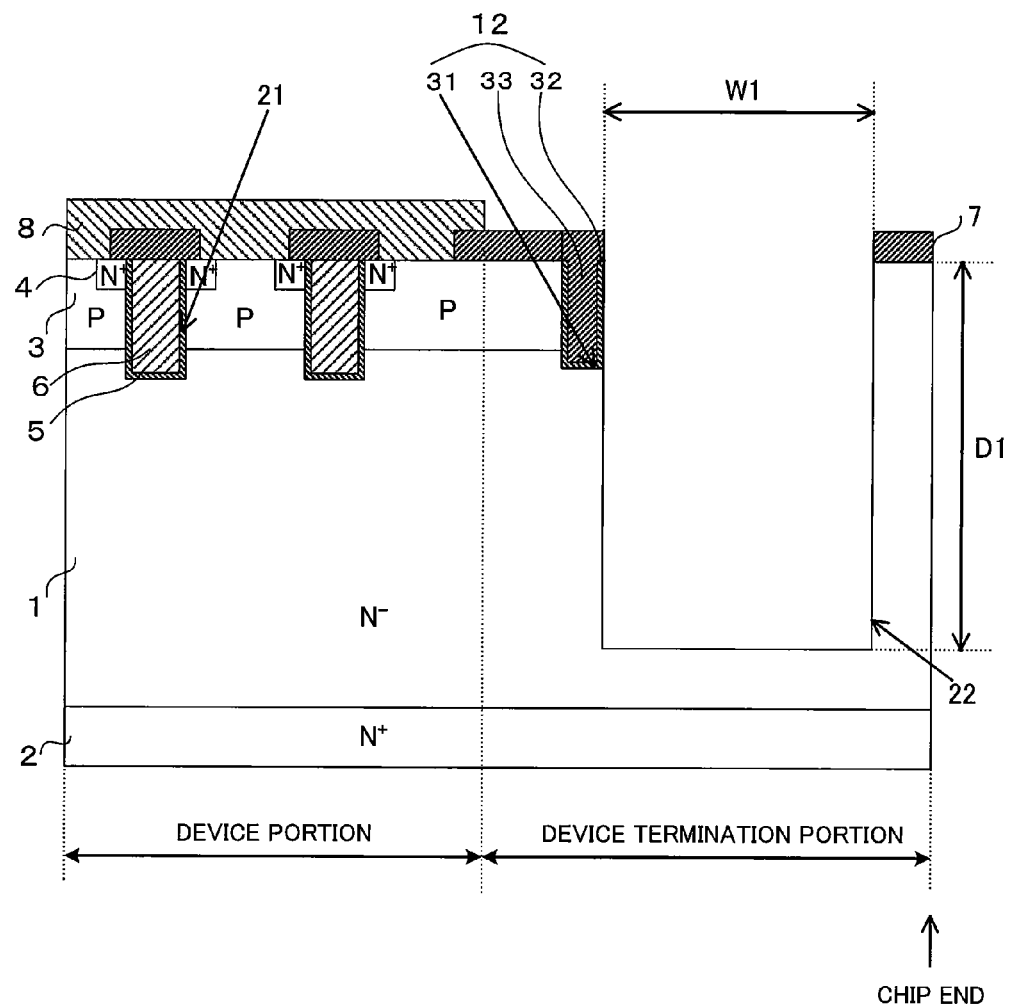
FIG. 8 is a cross-sectional diagram showing a manufacturing step for the semiconductor device according to the second embodiment.

Next, the method of manufacturing the semiconductor device is described with reference to FIGS. 6 to 8. FIGS. 6 to 8 are cross-sectional diagrams showing manufacturing steps for the semiconductor device.

As shown in FIG. 6, after the trench gate, the N⁺-source layers 4, and the insulating layer 7 are formed, the opening portion is formed by etching the insulating layer 7 in the device termination portion using the RIE, for example, with an unillustrated resist film as a mask. A portion of the N⁻-drift layer 1 below the opening portion is etched by the RIE using a different gaseous species with the resist film as a mask, and thus the trench 31 having the width W2 and the depth D2 is formed. In this process, the N⁻-drift layer 1 is etched under the same RIE condition as that for forming the trench 21 of the trench gate, for example. After the resist film is removed, a post-RIE treatment is performed to clean the bottom and side surfaces of the trench 31.

As shown in FIG. 7, the surfaces of the N⁻-drift layer 1 exposed at the bottom and side surfaces of the trench 31 is oxidized at a temperature of 1000° C. and in an oxygen ($O_2$) atmosphere. Thus, the insulating film 32 as the silicon thermally-oxidized film ($SiO_2$ film) is formed. Note that the thermal oxidation may be performed by adding a chlorine-based gas. The insulating film 33 is buried in the trench 31 in such a manner to cover the trench 31 via the insulating film 32. In the process, only the trench upper portion needs to be covered and the insulator 33 does not necessary have to be completely buried in the trench 31. After the insulating film 33 of the trench structure 12 is buried, the insulating film 33 is polished to smooth a top surface of the device portion and the device termination portion by chemical mechanical polishing (CMP), for example. As a result, the trench structure 12 including the trench 31, the insulating film 32, and the insulating film 33 is formed.

Next, as shown in FIG. 8, the opening portion is formed by etching the portion of the insulating film 7 in the device termination portion using the RIE, for example, with the unillustrated resist film as the mask. One end of the opening portion (on the device portion side) is in contact with the trench structure 12. The N⁻-drift layer 1 below the opening portion is etched by the deep RIE using a different gaseous species with the resist film as a mask, and thus the trench 22 having the width W1 and the depth D1 is formed. The subsequent steps are similar to those in the first embodiment and thus are not described.

As described above, in the semiconductor device and the method of manufacturing the same, the trench structure 11 including the trench 22 and the insulator 23 buried in the trench 22 is provided in the device termination portion. The trench structure 12 is provided between the P-base layer 3 and the trench structure 11. The trench structure 12 has the width W2 and the depth D2. The trench structure 12 includes the trench 31, the insulating film 32 formed of the silicon thermally-dioxide film ($SiO_2$ film) formed on the bottom and side surfaces of the trench 31, and the insulating film 33 buried in the trench 31 via the insulating film 32.

Accordingly, in addition to the effect of the first embodiment, it is possible to reduce a reverse leak current through a PN-diode including the P-base layer 3 and the N⁻-drift layer 1 in the device termination portion compared with the first embodiment.

Figure 9:
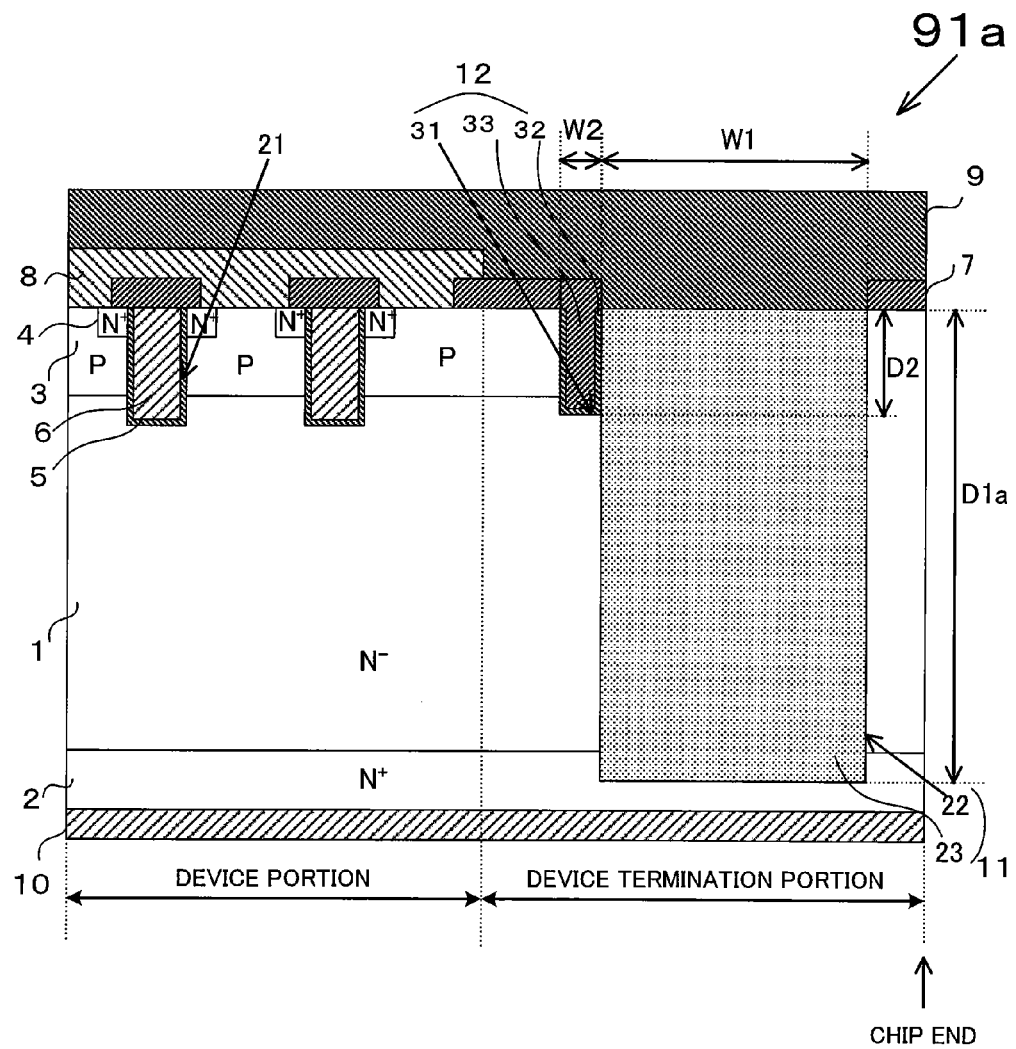
FIG. 9 is a cross-sectional diagram showing a semiconductor device of a first modification.

In the embodiment, the trench structure 11 is set to have the depth D1. However, the configuration is not necessarily limited to the above case. For example, as in a semiconductor device 91a of a first modification shown in FIG. 9, the trench 22 may penetrate the N⁻-drift layer 1 to reach the N⁺-drain layer 2, and thus the trench structure 11 may be set to have a depth D1a.

Figure 10:
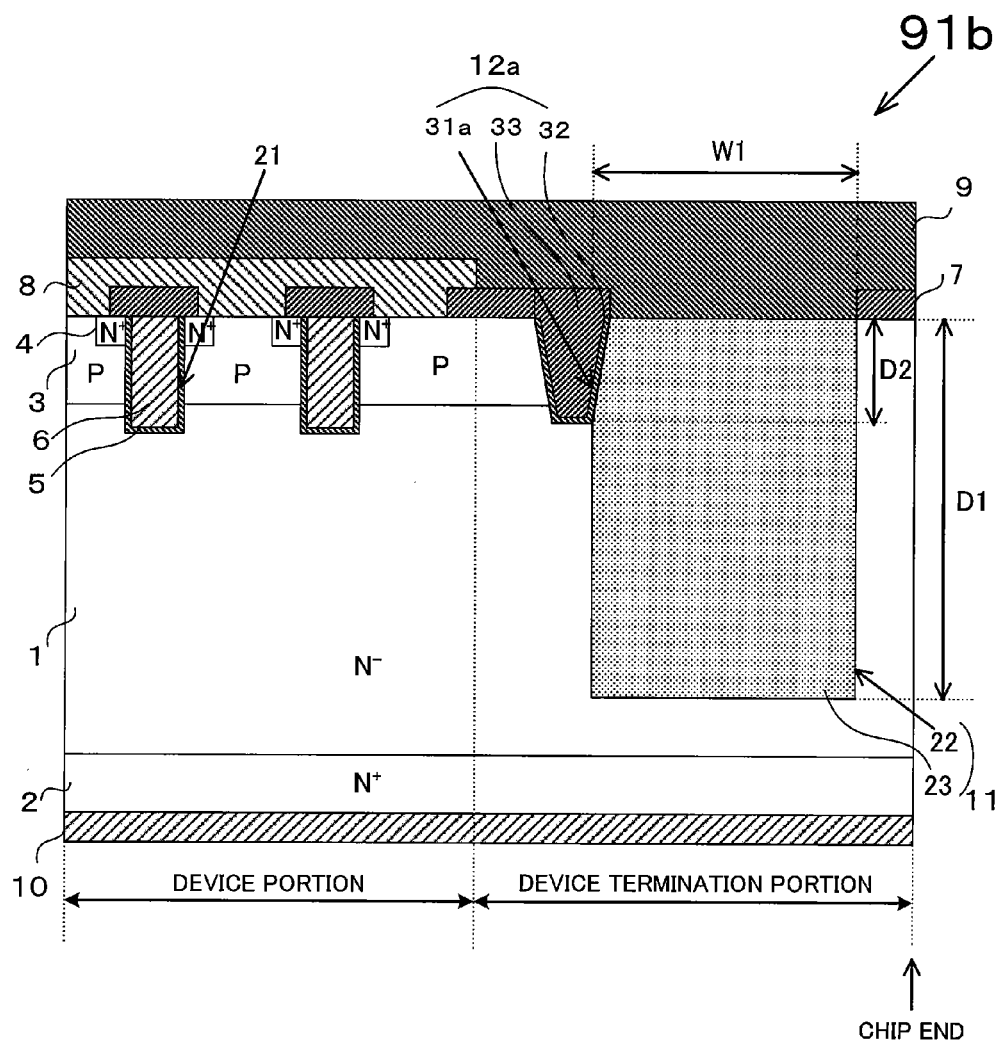
FIG. 10 is a cross-sectional diagram showing a semiconductor device of a second modification.

In the embodiment, the trench structure 12 is set to have a rectangular cross-sectional shape. However, the configuration is not necessarily limited to the above case. For example, a trench structure 12a having an inverted trapezoidal cross-sectional shape may be provided as in a semiconductor device 91b of a second modification shown in FIG. 10.

Figure 11:
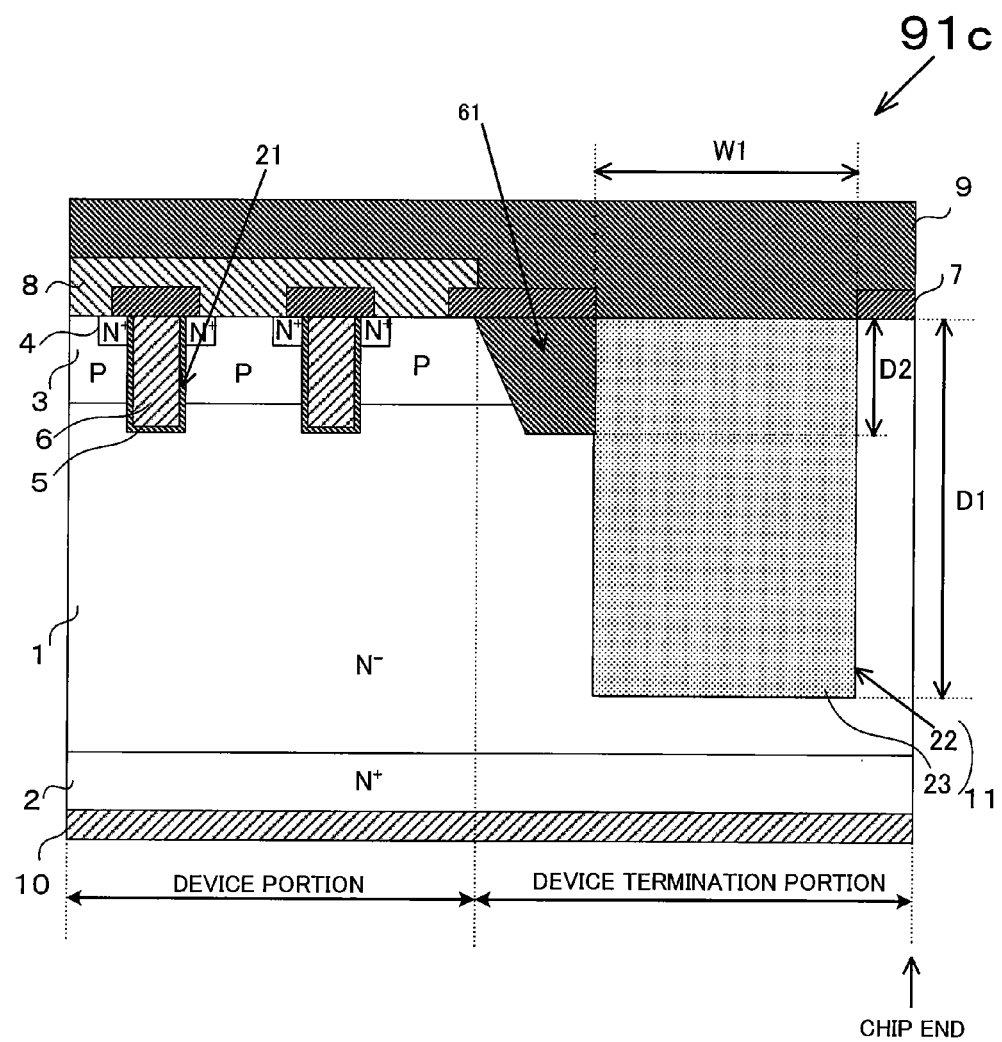
FIG. 11 is a cross-sectional diagram showing a semiconductor device of a third modification.

Furthermore, in the embodiment, the trench structure 12 is provided between the P-base layer 3 and the trench structure 11. However, the configuration is not necessarily limited to the above case. For example, a buried oxide film 61 may be provided between the P-base layer 3 and the trench structure 11 as in a semiconductor device 91c of a third embodiment shown in FIG. 11. Specifically, the depth D2 of the buried oxide film 61 is set to be larger than the depth of the P-base layer 3. The buried oxide film is an recessed LOCOS structure formed of the silicon thermally-oxidized film (SiO$_2$ film). The buried oxide film 61 is formed before the trench structure 11 is formed.

Figure 12:
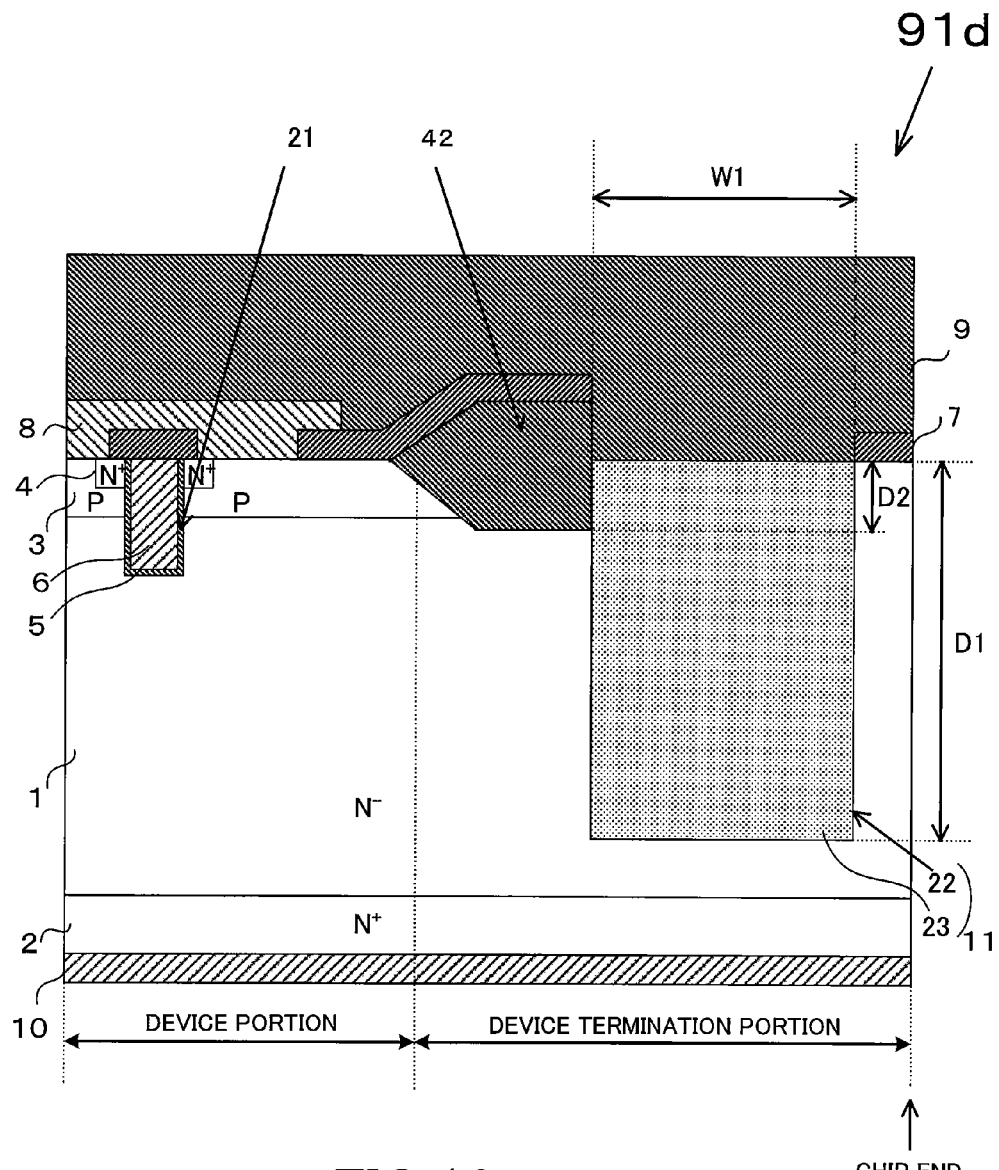
FIG. 12 is a cross-sectional diagram showing a semiconductor device of a fourth modification.

Furthermore, in the embodiment, the trench structure 12 is formed between the P-base layer 3 and the trench structure 11. However, the configuration is not necessarily limited to the above case. For example, a silicon dioxide film 42 may be provided between the P-base layer 3 and the trench structure 11 as in a semiconductor device 91d of a fourth modification shown in FIG. 12. Specifically, the depth D2 of the silicon dioxide film 42 is set to be larger than the depth of the P-base layer 3. The silicone dioxide film 42 is a LOCOS structure formed of the silicon thermally-oxidized film (SiO$_2$ film). The silicon dioxide film 42 is formed before the trench structure 11 is formed.

In the embodiment, the insulating film 32 formed of the silicon thermally-oxidized film (SiO$_2$ film) is provided on the side and bottom surfaces of the trench 31. However, the configuration is not necessarily limited to the above case. The insulating film 32 formed of the silicon thermally-oxidized film (SiO$_2$ film) needs to be provided at least on the device-portion-side surface and bottom surface of the trench 31.

Figure 13:
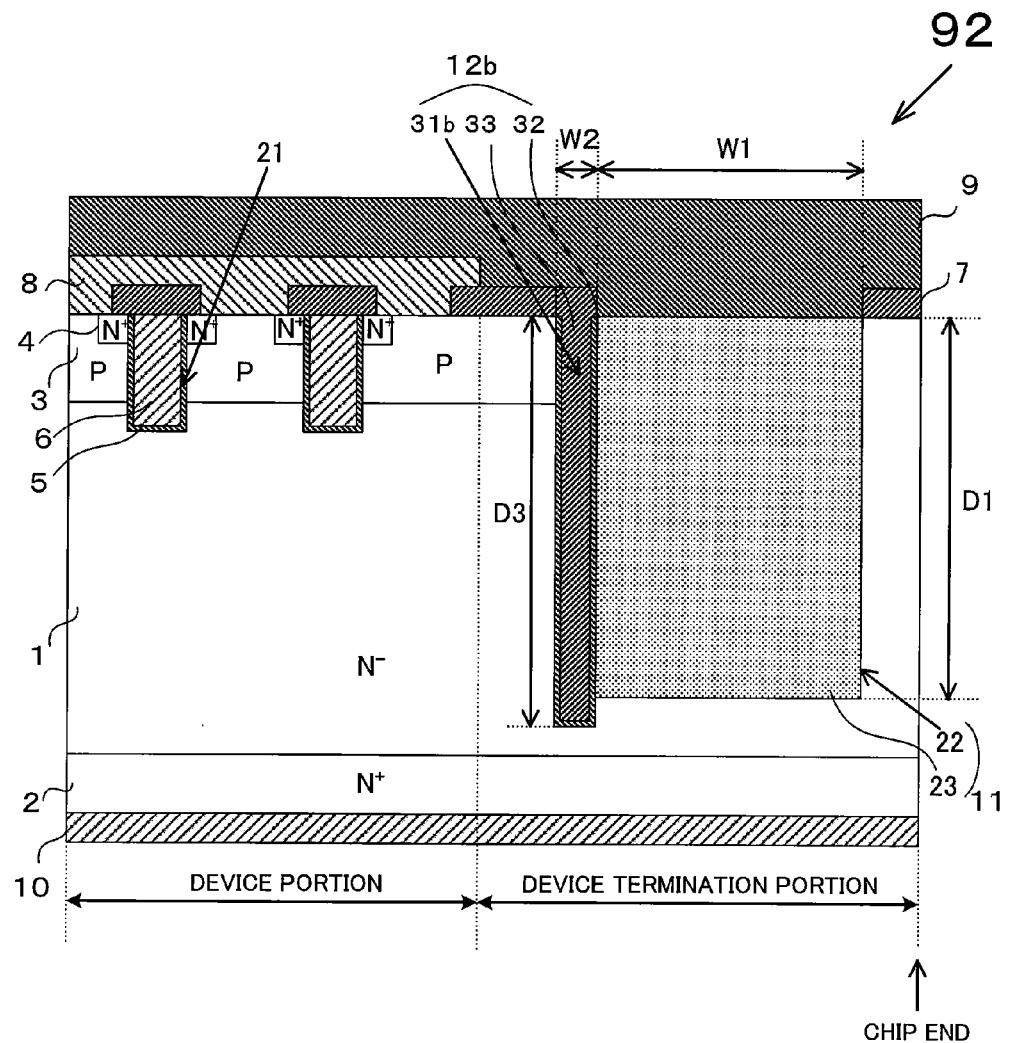
FIG. 13 is a cross-sectional diagram showing a semiconductor device according to a third embodiment.

A semiconductor device and a method of manufacturing the same according to a third embodiment will be described with reference to the drawings. FIG. 13 is a cross-sectional diagram showing the semiconductor device. In the embodiment, a depth D3 of a first trench structure in which a silicon thermally-oxidized film is provided on bottom and side surfaces of a first trench is set to be larger than the depth D1 of a second trench structure in which an insulator is buried in a second trench. Therefore, the leak current is improved.

Hereinafter, a portion with the same configuration in the first embodiment is provided with the same numeral, a description of the portion will not be repeated, and only a portion with a different configuration is described.

As shown in FIG. 13, a semiconductor device 92 is an N-channel trench power MOS transistor in which the trench structure 11 (second trench structure) as a deep trench is formed in the device termination portion, and a trench structure 12b (first trench structure) is formed between the trench structure 11 and the P-base layer 3. The semiconductor device 92 is used for a mobile terminal, a personal computer, a motor driver, and the like.

The trench structure 12b is formed on a portion of the surface of the N$^-$-drift layer 1 between the P-base layer 3 and the trench structure 11. The trench structure 12b has a width W2 and the depth D3. The depth D3 is larger than the depth D1 of the trench structure 11. The trench structure 12b includes a trench 31b, the insulating film 32 of the silicon thermally-oxidized film (SiO$_2$ film) formed on bottom surface and side surfaces of the trench 31b, and the insulating film 33 buried in the trench 31b in such a manner to cover the trench 31b via the insulating film 32. In the process, only the trench upper portion needs to be covered and the insulating film 33 does not necessary have to be completely buried in the trench 31b. Moreover, top portion of the insulating film 32 and the insulating film 33 is allowed to be etched in fabrication process of the trench structure 11.

Next, leak current characteristics at a PN junction end portion of the semiconductor device (N-channel trench power MOS transistor) will be described.

In the semiconductor device 91 of the second embodiment (see FIG. 5), the trench structure 12 having the depth larger than the depth of the P-base layer 3 and shallower than the trench structure 11 is formed between the P-base layer 3 and the trench structure 11.

In the semiconductor device 92 of the embodiment (see FIG. 13), the trench structure 12b having the depth larger than the depth of the P-base layer 3 and the trench structure 11 is formed between the P-base layer 3 and the trench structure 11. The side surface of the P-base layer 3 and a side surface of a portion of the N$^-$-drift layer 1 below the P-base layer 3 are in contact with the insulating film 32 of the silicon thermally-oxidized film (SiO$_2$ film) provided on the side surface of the trench 31b of the trench structure 12b. The surface of the portion of the N$^-$-drift layer 1 below the trench structure 12b is in contact with the portion of the insulating film 32 of the silicon thermally-oxidized film (SiO$_2$ film) provided on the bottom surface of the trench 31b of the trench structure 12b.

In the semiconductor device 92 of the embodiment, the side and bottom surfaces of the trench 31b are completely covered by the silicon thermally-oxide film. Therefore, a stable interface is always able to maintain, and thus, it is possible to improve the yield of the semiconductor device 92. Moreover, it is possible to reduce the reverse leak current through the PN diode including the P-base layer 3 and the N$^-$-drift layer 1 in the device termination portion compared with the semiconductor device 91 of the second embodiment.

As described above, in the semiconductor device and the method of manufacturing the same of the embodiment, the trench structure 11 including the trench 22 and the insulator 23 buried in the trench 22 is formed in the device termination portion. The trench structure 12b is provided between the P-base layer 3 and trench structure 11. The depth D3 of the trench structure 12b is larger than the depth D1 of the trench structure 11.

Accordingly, in addition to the effect provided by the first embodiment, it is possible to reduce the reverse leak current through the PN diode including the P-base layer 3 and the N$^-$-drift layer 1 in the device termination portion compared with the second embodiment.

In the embodiment, the trench structure 12b is set to have the depth D3. However, the configuration is not necessarily limited to the above case. The trench structure 12b may be formed to penetrate the N$^-$-drift layer 1 to reach the N$^+$-drain layer 2.

Figure 14:
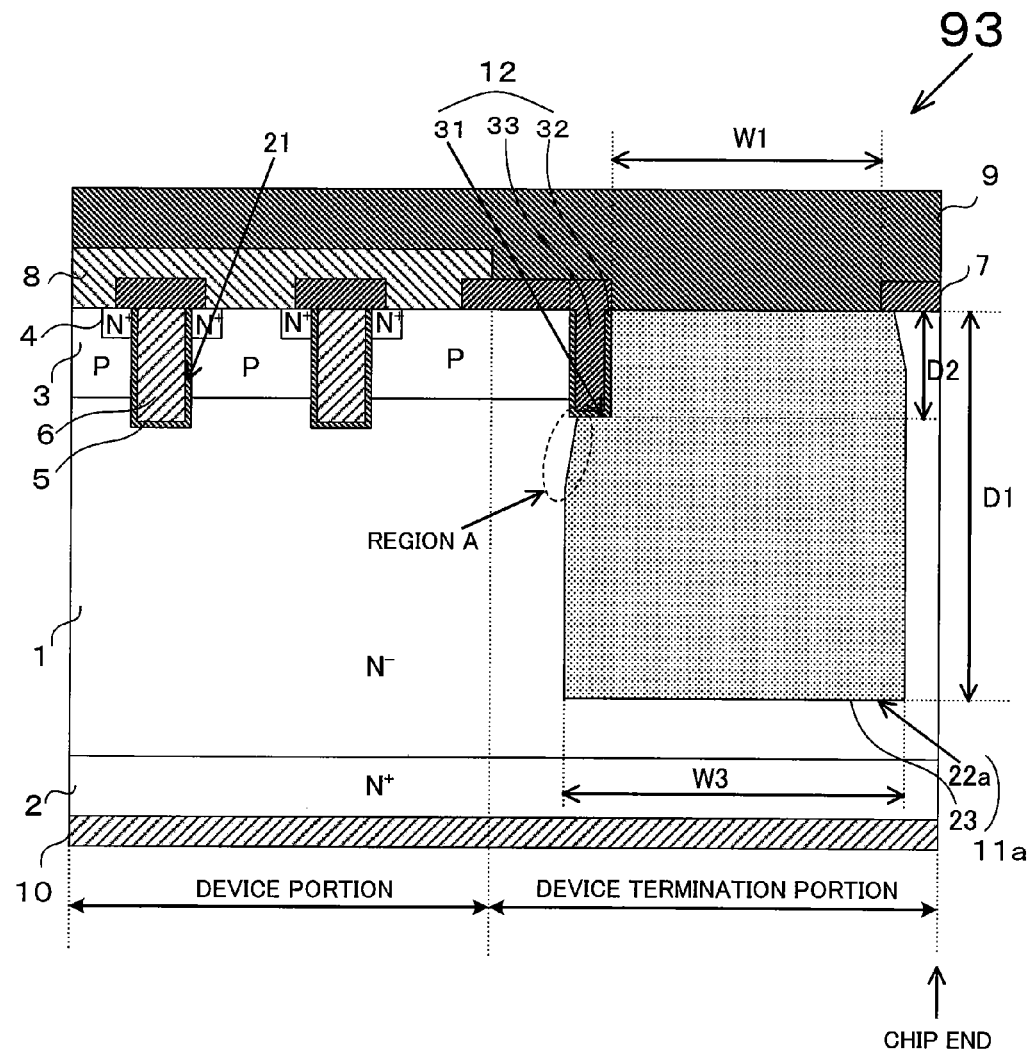
FIG. 14 is a cross-sectional diagram showing a semiconductor device according to a fourth embodiment.

A semiconductor device and a method of manufacturing the same according to a fourth embodiment will be described with reference to the drawings. FIG. 14 is a cross-sectional diagram showing the semiconductor device. In the embodiment, the shape of the second trench of the second trench structure is changed to improve a breakdown voltage.

Hereinafter, a portion with the same configuration in the first embodiment is provided with the same numeral, a description of the portion will not be repeated, and only a portion with a different configuration is described.

As shown in FIG. 14, a semiconductor device 93 is an N-channel trench power MOS transistor in which a trench structure 11a (second trench structure) as a deep trench is formed in the device termination portion, and the trench structure 12 (first trench structure) is formed between the trench structure 11a and the P-base layer 3. The semiconductor device 93 is used for a mobile terminal, a personal computer, a motor driver, and the like.

The trench structure 11a includes a trench 22a and the insulator 23 buried in the trench 22a. An upper portion of one end (on the device portion side) of the trench 22a is in contact with the side and bottom surfaces of the trench structure 12. An upper portion of the portion of the trench 22a below the trench structure 12, shown as a region A, has a tapered shape (a deeper portion extends more toward the device portion).

The region A may be formed in all area of the side surface of the trench structure 11a, not only in the top portion of the trench structure 11a.

Next, characteristics at the PN junction end portion of the semiconductor device (N-channel trench power MOS transistor) will be described.

In the semiconductor device 91 of the second embodiment (see FIG. 5), the trench structure 12 extending deeper than the P-base layer 3 and shallower than the trench structure 11 is formed between the P-base layer 3 and the trench structure 11.

In contrast, in the semiconductor device 93 of the embodiment (see FIG. 14), the trench structure 12 is provided between the P-base layer 3 and the trench structure 11a. The upper portion of the trench 22a below the trench structure 12 has a taper shape (a deeper portion extends more toward the device portion).

Therefore, when a voltage is applied for the semiconductor device 93 of the embodiment, a concentration of electrical field at the portion below the P-base layer 3 (at the region A) is relieved (as well as the taper shape of the first embodiment). Thus, it is possible to improve the breakdown voltage of the PN diode including the P-base layer 3 and the $N^-$-drift layer 1 in the device termination portion than that of the semiconductor device 91 of the second embodiment.

Figure 15:
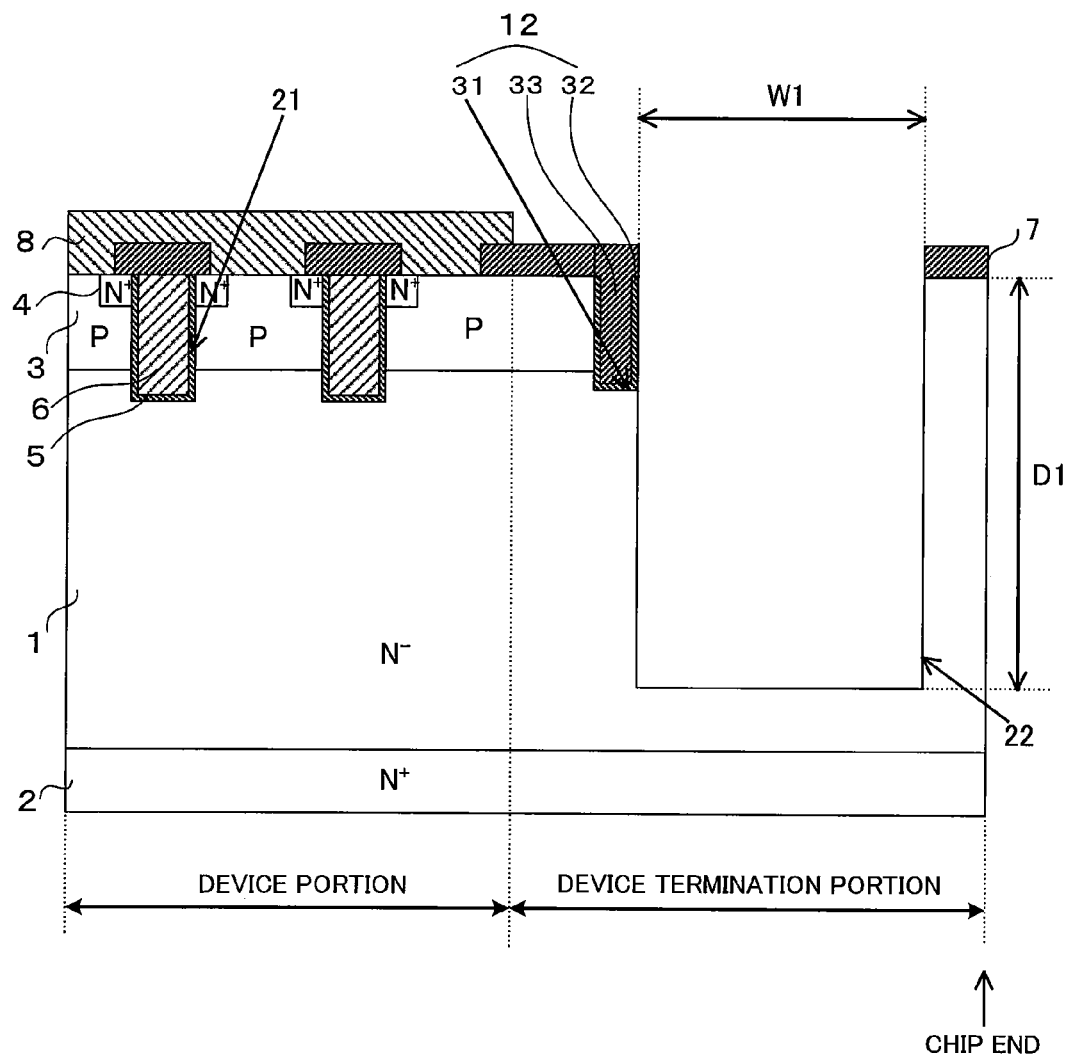
FIG. 15 is a cross-sectional diagram showing a manufacturing step for the semiconductor device according to the fourth embodiment.
Figure 16:
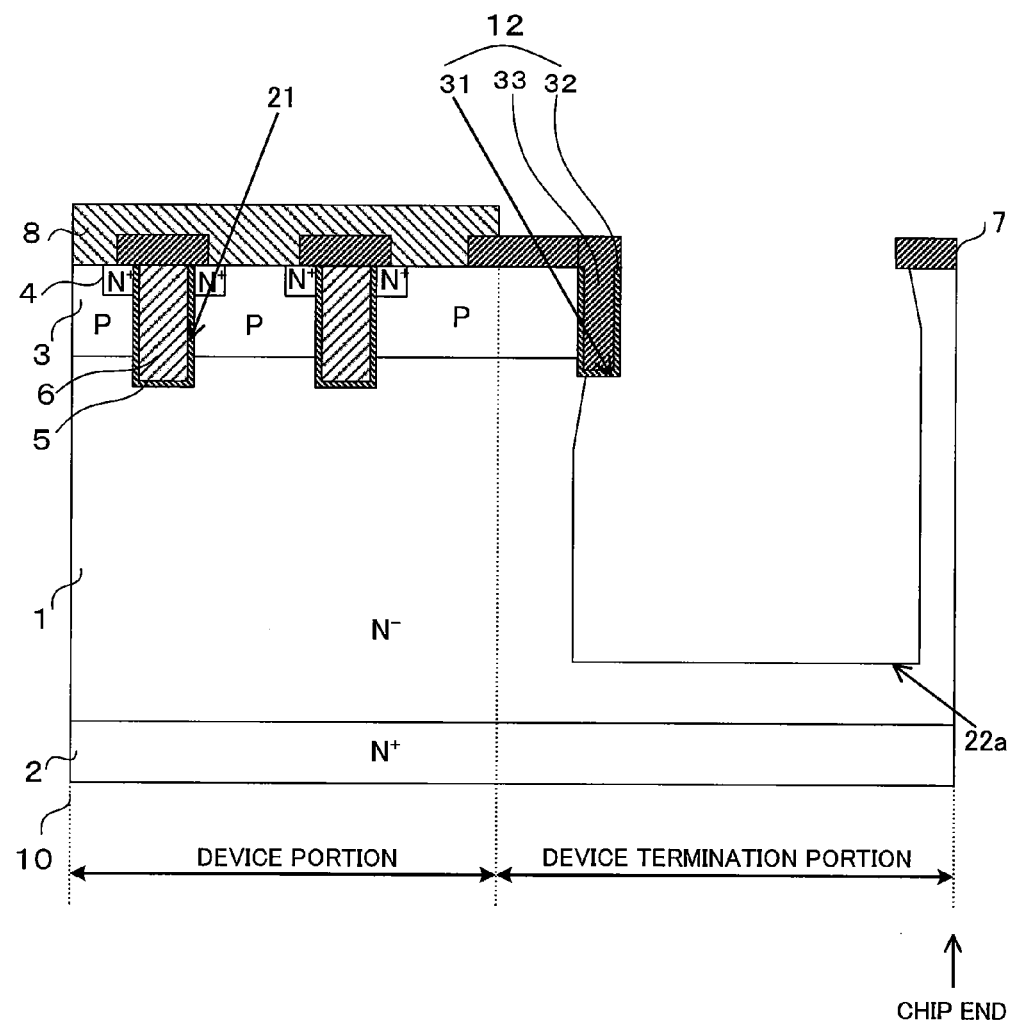
FIG. 16 is a cross-sectional diagram showing a manufacturing step for the semiconductor device according to the fourth embodiment.

Next, the method of manufacturing the semiconductor device will be described with reference to FIG. 15 and FIG. 16. FIG. 15 and FIG. 16 are cross-sectional diagrams showing manufacturing steps for the semiconductor device.

As shown in FIG. 15, after the trench structure 12 is formed, the opening portion is formed by etching the portion of the insulating film 7 in the device termination portion by RIE, for example, with the unillustrated resist film as a mask. One end (on the device portion side) of the opening portion is in contact with the trench structure 12.

Next, as shown in FIG. 16, the side and bottom surfaces of the trench 22a are etched by chemical dry etching (CDE), for example. Thus, one end side (on the device portion side) of the trench 22a below the trench structure 12 and the other end surface (on the chip end side) of the trench 22a have the taper shapes. The subsequent steps are similar to those in the first embodiment and thus are not described.

As described above, in the semiconductor device and the method for manufacturing the same of the embodiment, the trench structure 11a including the trench 22a and the insulator 23 buried in the trench 22a is formed in the device termination portion. The trench structure 12 is provided between the P-base layer 3 and trench structure 11a. The upper portion on one end (on the device portion side) of the trench 22a is formed in such a manner in contact with bottom and side surfaces of the trench structure 12. The portion of the trench 22a below the trench structure 12 has a taper shape.

Accordingly, in addition to the effect provided by the first embodiment, it is possible to improve the breakdown voltage of the PN diode including the P-base layer 3 and the $N^-$-drift layer 1 in the device termination portion than that of the second embodiment.

Figure 17:
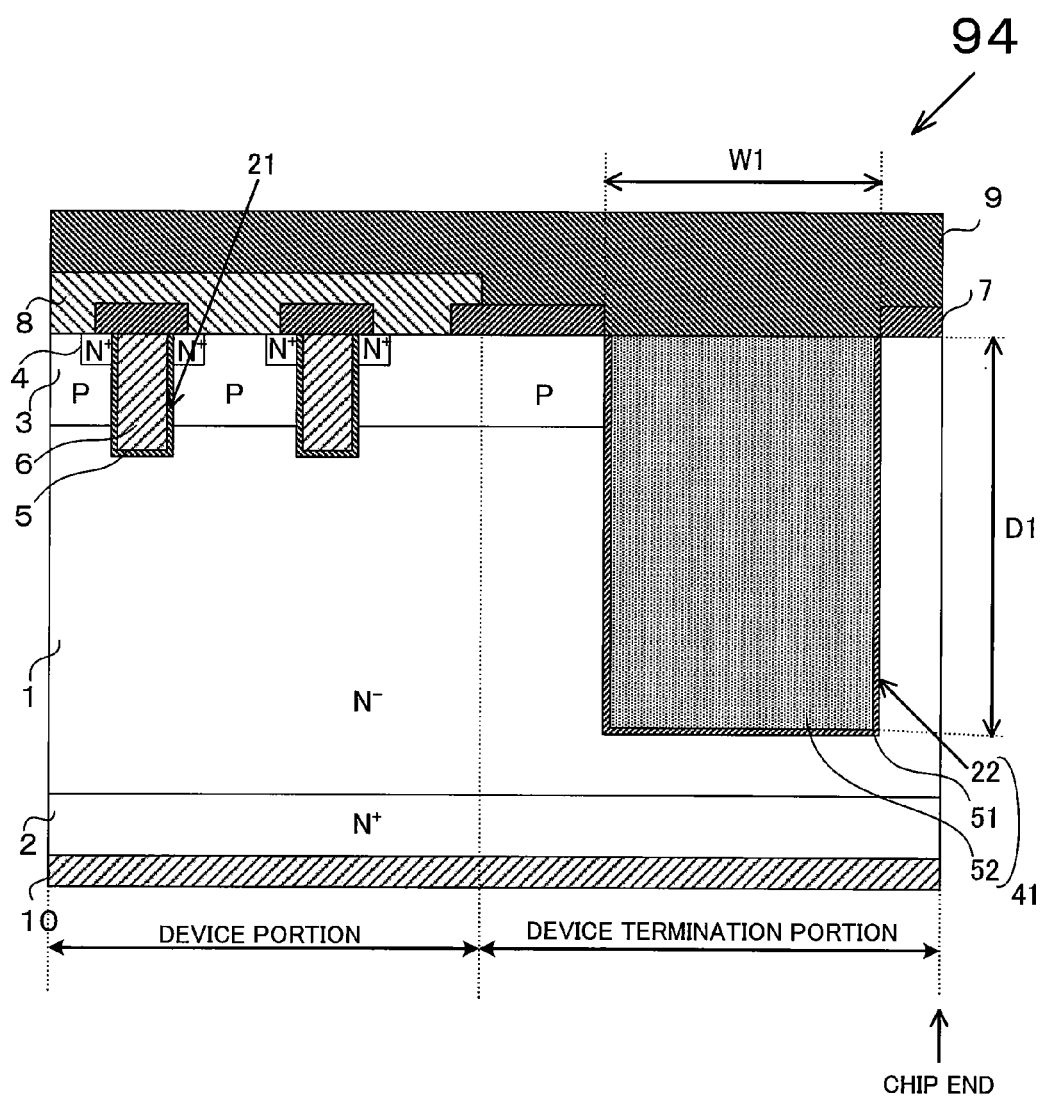
FIG. 17 is a cross-sectional diagram showing a semiconductor device according to a fifth embodiment.

A semiconductor device and a method of manufacturing the same according to a fifth embodiment will be described with reference to the drawings. FIG. 17 is a cross-sectional diagram showing the semiconductor device. In the embodiment, a silicon dioxide film is formed on side and bottom surfaces of a trench structure by oxidizing a silicon substrate using $Kr/O_2$ plasma at a low temperature.

Hereinafter, a portion with the same configuration in the first embodiment is provided with the same numeral, a description of the portion will not be repeated, and only a portion with a different configuration is described.

As shown in FIG. 17, a semiconductor device 94 is an N-channel trench power MOS transistor in which a trench structure 41 as a deep trench is formed in the device termination portion. The semiconductor device 94 is used for a mobile terminal, a personal computer, a motor driver, and the like.

The trench structure 41 includes the trench 22, a silicon dioxide film 51, and an insulator (polyimide) 52. The silicon dioxide film 51 and the insulator 52 are formed and stacked in the trench 22 in such a manner to cover the trench 22. The silicon dioxide film 51 is provided on side and bottom surfaces of the trench 22. The insulator 52 is buried in the trench 22 in such a manner to cover the trench 22 via the silicon dioxide film 51. The silicon dioxide film 51 is formed by oxidizing a silicon substrate (the $N^-$-drift layer 1 and the P-base layer 3) using $Kr/O_2$ plasma at a low temperature. The insulating film 9 is formed on the trench structure 41.

The silicon dioxide film 51 is an oxidized film having a film quality equal to that of the silicon thermally-oxidized film formed by oxidizing the silicon substrate at a temperature equal to or higher than 900° C. Specifically, the leak current, TDDB characteristics, an interface state density, and the like are at levels equal to those of the silicon thermally-oxidized film. The silicon dioxide film 51 is formed at a relatively low temperature and thus does not degrade the characteristics of the device portion (N-channel trench power MOS transistor). By using the silicon dioxide film 51 for the trench structure 41 of the trench termination portion, it is possible to have a stable interface state by binding silicon and oxygen than the interface state between the silicon substrate (the $N^-$-drift layer 1 and the P-base layer 3) and the insulating film 23 of the first embodiment. Therefore, it is possible to reduce a fluctuation of characteristics and establish a high-reliability of the semiconductor device 94.

Figure 18:
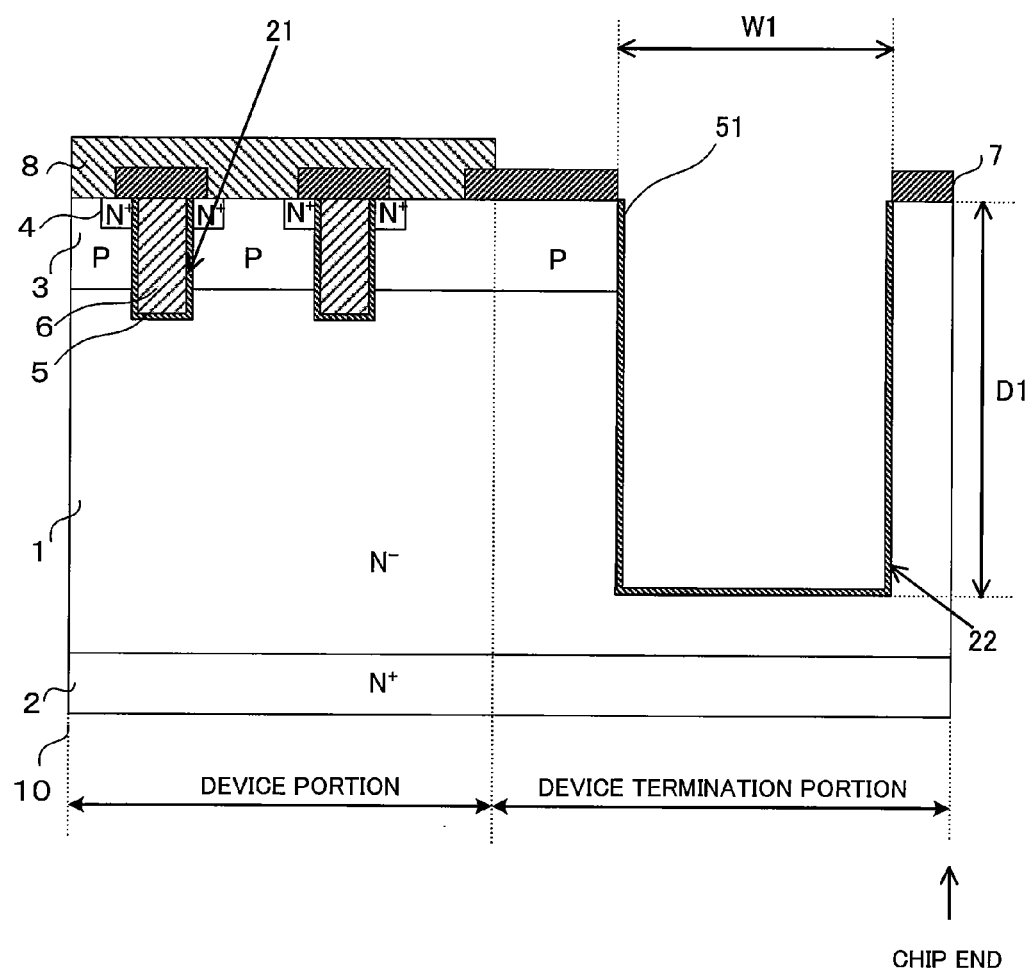
FIG. 18 is a cross-sectional diagram showing a manufacturing step for the semiconductor device according to the fifth embodiment.
Figure 19:
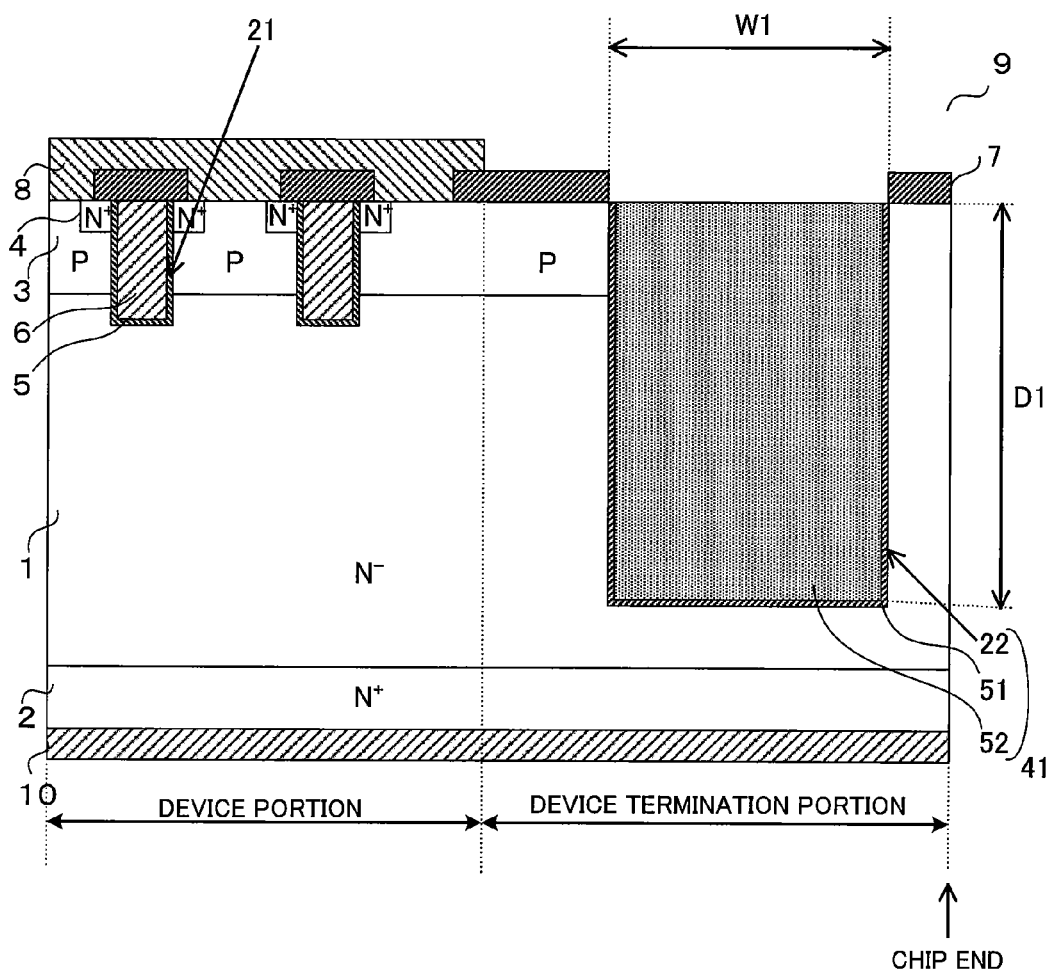
FIG. 19 is a cross-sectional diagram showing a manufacturing step for the semiconductor device according to the fifth embodiment.

The method of manufacturing the semiconductor device is described with reference to FIG. 18 and FIG. 19. FIG. 18 and FIG. 19 are cross-sectional diagrams showing manufacturing steps for the semiconductor device.

As shown in FIG. 18, after the trench 22 is formed in the device termination portion, an oxygen radical is generated with a combination of Kr (krypton)/$O_2$ gases and by microwave excitation in a substrate temperature of 300° C., for example, ($Kr/O_2$ plasma method). The portion of the silicon substrate (the $N^-$-drift layer 1 and the P-base layer 3) on the side and bottom surfaces of the trench 22 is oxidized by the generated oxygen plasma. Thus, the silicon dioxide film 51 is formed. Although the $Kr/O_2$ gas is used in this process, an oxygen plasma using an $O_2$ gas ($O_2$ plasma method), a photo-excitation method, or the like may be used instead.

Next, as shown in FIG. 19, the insulator 52 is buried in the trench 22 via the silicon dioxide film 51 in such a manner to cover the trench 22. Although the polyimide film as the insulator 52 is used in this process, a poly-benzoxazole (PBO) film or a poly-benzocyclobutene (BCB) film may be used instead. The subsequent steps are similar to those in the first embodiment and thus are not described.

As described above, in the semiconductor device and the method for manufacturing the same of this embodiment, the trench structure 41 in which the silicon dioxide film 51 and the insulator 52 are formed and stacked in the trench 22 is provided in the device termination portion. One side surface of the trench structure 41 is in contact with the P-base layer 3, the trench structure 41 has the width W1 and the depth D1. The silicon dioxide film 51 is formed by oxidizing the silicon substrate (the $N^-$-drift layer 1 and the P-base layer 3) using the oxygen radical generated with the combination of Kr/O$_2$ gases at a relatively low temperature.

Accordingly, in addition to the effect provided by the first embodiment, it is possible to decrease the interface state density compared with that of the semiconductor device 90 of the first embodiment. It is possible to reduce the reverse leak current through the PN diode including the P-base diode 3 and the N$^-$-drift layer 1 compared with that of the first embodiment. Moreover, it is possible to establish a high-reliability of the semiconductor device 94.

The invention is not limited to the above-described embodiments, and various modifications can be made without departing from the spirit of the invention. The PN-junction leak current at the device termination portion is reduced by providing the trench structures 12, 12a in contact with the trench structure 11 in the second embodiment, by providing the trench structure 12b in contact with the trench structure 11 in the third embodiment, and by providing the trench structures 12 in contact with the trench structure 11a in the fourth embodiment. The configuration is not necessarily limited to the above cases. Any configuration can be employed as long as the silicon thermally-oxidized film is formed to reduce the junction leak current flowing through the PN-junction end portion of the P-base layer 3 and the N$^-$-drift layer 1. The trench structures 12, 12a, 12b may be formed when the trench is formed in the device.

In the embodiments, although the trench structure is applied to the N-channel trench power MOS transistor, the trench structure may also be applied to a planar-type power MOS transistor, an IGBT, a diode, and the like.

While certain embodiments have been described, these embodiments have been presented by way of example only, and are not intend to limit the scope of the inventions. Indeed, the novel embodiments described herein may be embodied in a variety of the other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor device, comprising:
   a first trench structure in which
      a first trench is provided in a surface of a device termination portion of a first semiconductor layer of a first conductive type that includes a device portion and the device termination portion,
      a silicon dioxide film (SiO$_2$ film) is provided on bottom and side surfaces of the first trench, and
      a first insulator is buried in the first trench in such a manner to cover the first trench via the silicon dioxide film (SiO$_2$ film);
   a second semiconductor layer of a second conductive type provided on the surface of the first semiconductor layer, the second semiconductor layer being in contact with a device portion side of the first trench, the second semiconductor layer having a smaller depth than the first trench; and
   a second trench structure in which
      a second trench is provided in the surface of the first semiconductor layer, the second trench being in contact with a side of the first trench opposite to the second semiconductor layer and wider than the first trench, and
      a second insulator is buried in the second trench in such a manner to cover the second trench, wherein
   the second trench extends in such a manner to cover a bottom portion of the first trench, and
   a portion of the second trench below the bottom portion of the first trench has a taper shape inclined toward the device portion.

2. The semiconductor light emitting device according to claim 1, further comprising:
   a third insulator provided on the first trench structure and the second trench structure so as to cover the first trench structure and the second trench structure.

3. The semiconductor device according to claim 2, wherein the second and third insulators are any one of a polyimide film, a poly-benzoxazole (PBO) film, and a poly-benzocyclobutene (BCB) film.

4. The semiconductor device according to claim 1, wherein the semiconductor device is any one of a metal-oxide-semiconductor (MOS) transistor, an insulated-gate bipolar transistor (IGBT), and a diode.

* * * * *